United States Patent
Adomi et al.

[11] Patent Number: 5,442,203
[45] Date of Patent: Aug. 15, 1995

[54] SEMICONDUCTOR LIGHT EMITTING DEVICE HAVING ALGAASP LIGHT REFLECTING LAYERS

[75] Inventors: Keizo Adomi; Nobuhiko Noto; Takao Takenaka, all of Annaka, Japan

[73] Assignee: Shin-Etsu Handotai Co., Ltd., Tokyo, Japan

[21] Appl. No.: 299,084

[22] Filed: Aug. 18, 1994

[30] Foreign Application Priority Data

Aug. 24, 1993 [JP] Japan .................... 5-230977

[51] Int. Cl.⁶ .................... H01S 3/19; H01L 33/00
[52] U.S. Cl. .................... 257/97; 257/98; 372/45; 372/96; 372/98
[58] Field of Search .................... 257/94, 96, 97, 98; 372/45, 46, 92, 96, 98

[56] References Cited

U.S. PATENT DOCUMENTS 5,153,889 10/1992 Sugawara et al. .................... 372/45

FOREIGN PATENT DOCUMENTS

| 3108778 | 5/1991 | Japan | 257/98 |
| 496381 | 3/1992 | Japan | 257/98 |
| 4186679 | 7/1992 | Japan | 257/98 |
| 5259508 | 10/1993 | Japan | 257/98 |

*Primary Examiner*—William Mintel
*Assistant Examiner*—Minhloan Tran
*Attorney, Agent, or Firm*—Ronald R. Snider

[57] ABSTRACT

A semiconductor light emitting device has a light emitting layer portion comprising AlGaInP layers formed on a GaAs substrate. A light reflecting layer portion comprising alternately laminated layers with different refractive indices is provided between the GaAs substrate and the light emitting layer portion. The light reflecting layer portion comprises $Al_wGa_{1-w}As_{1-v}P_v$ layers (where: $0 \leq w \leq 1$, $0 < v \leq 0.05\,w$). An active layer which constitutes the light emitting layer portion comprises an $(Al_yGa_{1-y})_{0.51}In_{0.49}P$ layer (where: $0 \leq y \leq 0.7$).

7 Claims, 3 Drawing Sheets

SEMICONDUCTOR LIGHT EMITTING DEVICE HAVING ALGAASP LIGHT REFLECTING LAYERS

RELATED APPLICATIONS

This application claims the priority of Japanese Patent Application No. 5-230977 filed on Aug. 24, 1993, which is incorporated herein by reference.

BACKGROUND OF THE INVENTION

1. Field of the Invention

This invention relates to a semiconductor light emitting device, and more precisely to a visible light emitting element (semiconductor laser, light emitting diode, etc.), in particular to the structure of a light emitting diode which has an AlGaInP active layer formed by means of epitaxial growth on a GaAs substrate.

2. Prior Art

A light emitting diode in which a light emitting layer portion consisting of an AlGaInP double heterojunction structure is known to have a very high quantum efficiency, and has been put into practical use as a high brightness visible light emitting diode. The light emitting layer portion comprises an AlGaInP active layer and first and second AlGaInP cladding layers which sandwich the active layer. These AlGaInP layers have different composition ratios and are grown on a GaAs substrate while lattice match is maintained.

However, the energy of photons emitted from the AlGaInP active layer is larger than the band gap of GaAs which constitutes the substrate, hence the GaAs substrate acts as an absorption layer for the emitted light. Therefore, the light emitted toward the GaAs substrate is absorbed by the GaAs substrate, leaving only the light emitted toward a light extracting side to contribute to the brightness of the light emitting diode, thus resulting in inefficient brightness.

For the purpose of reducing absorption of the emitted light by the GaAs substrate, there is a method in which a light reflecting layer comprising alternately laminated layers with different refractive indices is provided between the GaAs substrate and the light emitting layer portion so that the light emitted toward the GaAs substrate is reflected by the light reflecting layer toward the light extracting side, so as to improve the light extraction efficiency. The light reflecting layer is generally formed by alternately laminating a large number of layers with a high refractive index and layers with a low refractive index wherein the optical thickness of each layer is approximately ¼ of the wavelength of the emitted light. AlGaAs, AlGaInP, or a combination of these materials have been used for the light reflecting layers.

A light reflecting layer using $Al_wGa_{1-w}As$ is most widely used partly because $Al_wGa_{1-w}As$ is in approximate lattice match with GaAs. For example, a light reflecting layer formed by alternately laminating $Al_{0.6}Ga_{0.4}As$ layers and $Al_{0.8}Ga_{0.2}As$ layers is used in particular.

FIG. 3 shows a cross-sectional structure of a conventional light emitting diode which has a light reflecting layer using $Al_wGa_{1-w}As$. In this light emitting diode, a light reflecting layer 11, a light emitting layer portion 15 and a p-type current spreading layer 16 are formed one after another on an n-type GaAs substrate 10. The light emitting layer portion 15 has a double heterojunction structure comprising an n-type AlGaInP cladding layer 12, an AlGaInP active layer 13 and a p-type AlGaInP cladding layer 14 layered one after another. The composition ratio in said active layer 13 is determined according to a desired emission wavelength. An example would be $(Al_yGa_{1-y})_{0.51}In_{0.49}P$ (where $0 \leq y \leq 0.7$). The light reflecting layer 11 comprises a large number of alternately laminated n-type $Al_{0.6}Ga_{0.4}As$ layers 11a and n-type $Al_{0.8}Ga_{0.2}As$ layers 11b, each having a thickness of approximately 400 Å. The p-type current spreading layer 16 (for example, a p-type $Al_{0.7}Ga_{0.3}As$ current spreading layer) is provided to effectively spread the current from a p-electrode (not shown in the figure) which is formed on said current spreading layer 16 into the entire area of the AlGaInP active layer 13 which is a light emitting layer, so that light emission can be more efficient.

As described above, $Al_{0.6}Ga_{0.4}As$ and $Al_{0.8}Ga_{0.2}As$ are in relatively good lattice match with GaAs. However, there is approximately 0.1% lattice mismatch at room temperature, causing an internal stress in the light reflecting layer. This leads to deterioration of the light emitting characteristics when the light emitting diode is used for light emission by supplying an electricity over an extended time.

When AlGaInP is used for the light reflecting layer, the lattice mismatch with GaAs at room temperature can be made very small by controlling the mixed crystal composition, particularly the In composition. Therefore, it is possible to form a light reflecting layer with a considerable reflectivity and no internal stress, by optimizing the compositions of the alternately laminated AlGaInP layers. However, since it is difficult to grow an AlGaInP layer with a total thickness of over 3-4 micrometers on a GaAs substrate without compromising the crystalline quality, it is preferable not to use this material for the light reflecting layer.

BRIEF SUMMARY OF THE INVENTION

The object of this invention is to provide a semiconductor light emitting device comprising a light reflecting layer in which there is no internal stress and the light emitting characteristics does not deteriorate after an extended time of light emitting operation by supplying an electricity. This invention provides a semiconductor light emitting device in which a light emitting layer portion comprising AlGaInP layers is formed on a GaAs substrate, and a light reflecting layer comprising alternately laminated layers with different refractive indices is provided between the GaAs substrate and the light emitting layer portion, characterized by the fact that the material of said light reflecting layer is $Al_wGa_{1-w}As_{1-v}P_v$ (where: $0 \leq w \leq 1$, $0 < v \leq 0.05\,w$), such as $Al_{0.6}Ga_{0.4}As_{0.98}P_{0.02}$ and $Al_{0.8}Ga_{0.2}As_{0.97}P_{0.03}$, for example. A material of an active layer which constitutes said light emitting layer portion is $(Al_yGa_{1-y})_{0.51}In_{0.49}P$ (where: $0 \leq y \leq 0.7$), for example.

The $Al_wGa_{1-w}As_{1-v}P_v$ (where: $0 \leq w \leq 1$, $0 < v \leq 0.05\,w$) mixed crystal used for the light reflecting layer in this invention has very good lattice match with the GaAs substrate and has significantly reduced internal stress caused by the lattice mismatch between the layers at room temperature. It can also be grown relatively thick on the GaAs substrate without compromising crystalline quality. Since an amount of P added for lattice-matching with the GaAs substrate is very small, the electrical and optical characteristics of AlGaAsP is not much different from those of AlGaAs. Therefore, when $Al_wGa_{1-w}As_{1-v}P_v$ is used for the light reflecting layer, the light reflecting layer, which has no internal stress and has a high light reflectivity, can be obtained without compromising crystalline quality, resulting in the improvement of the long-term reliability.

$Al_wGa_{1-w}As_{1-v}P_v$, for example $Al_{0.6}Ga_{0.4}As_{0.98}P_{0.02}$ and $Al_{0.8}Ga_{0.2}As_{0.97}P_{0.03}$ has a different thermal expansion coefficient from that of GaAs, hence $Al_wGa_{1-w}As_{1-v}P_v$ and GaAs are actually in a state of lattice mismatch at growth temperature, 710° C. for example. The lattice mismatch at growth temperature is approximately 0.1%, which is roughly the same as the lattice mismatch between $Al_{0.6}Ga_{0.4}As$ and GaAs at room temperature. Generally, when crystals in a state of lattice mismatch are epitaxially grown, misfit dislocations are introduced, adversely affecting the device characteristics. In the case of the light reflecting layer, however, the thickness of each layer is as thin as approximately 400 Å. So lattice mismatch is accommodated by the elastic deformation of the epitaxial layers, and misfit dislocations are not introduced. It is known that when a multi-layer is formed under such conditions, the density of the penetrating dislocation from the substrate to the epitaxial layer is reduced due to the so-called "strained layer superlattice effect". Therefore, a double improvements in device characteristics can be achieved by the use of $Al_wGa_{1-w}As_{1-v}P_v$.

DETAILED DESCRIPTION

Figure 2:
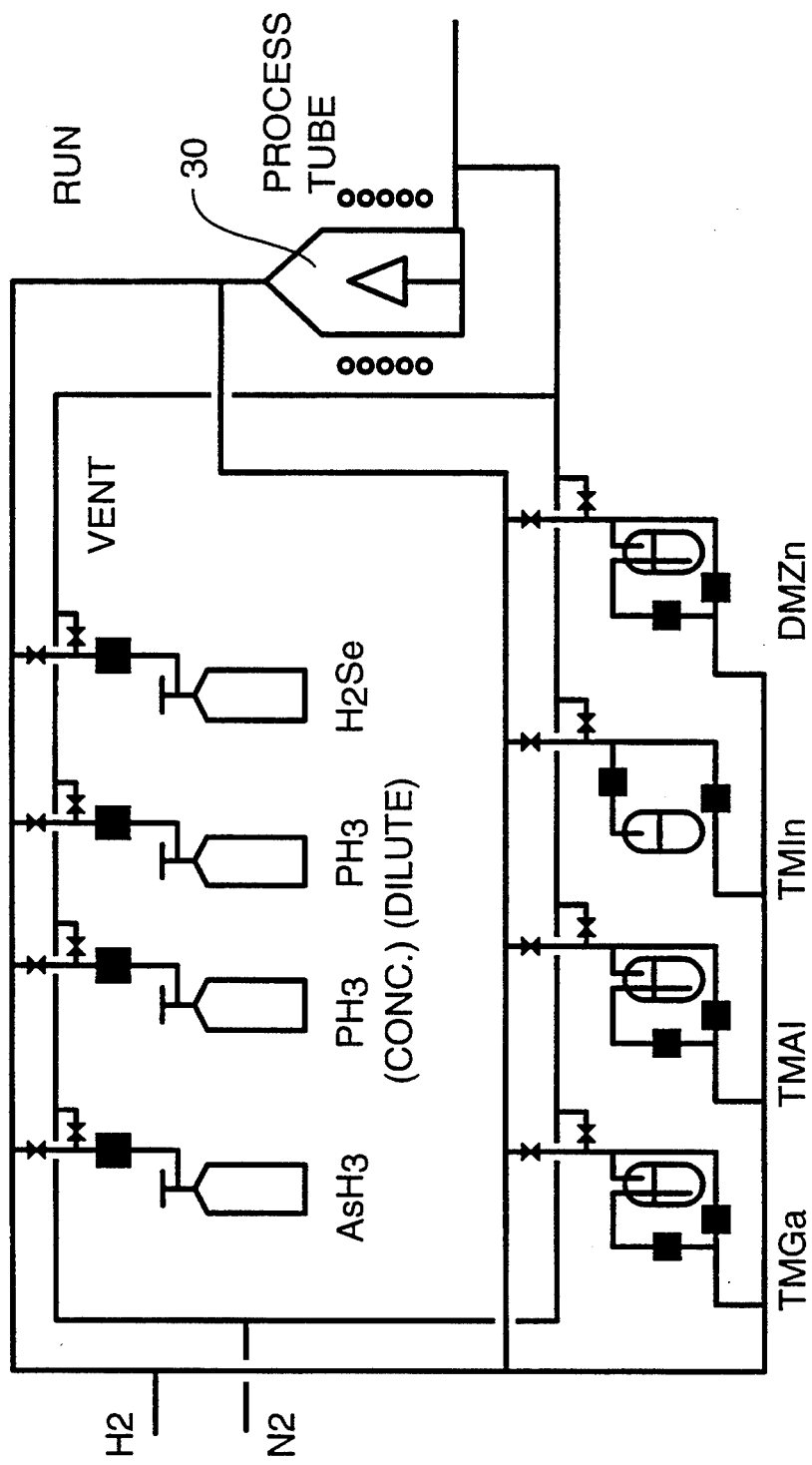
FIG. 2 is a schematic configuration of the growth apparatus used for growing each layer by the MOVPE method.
Figure 3:
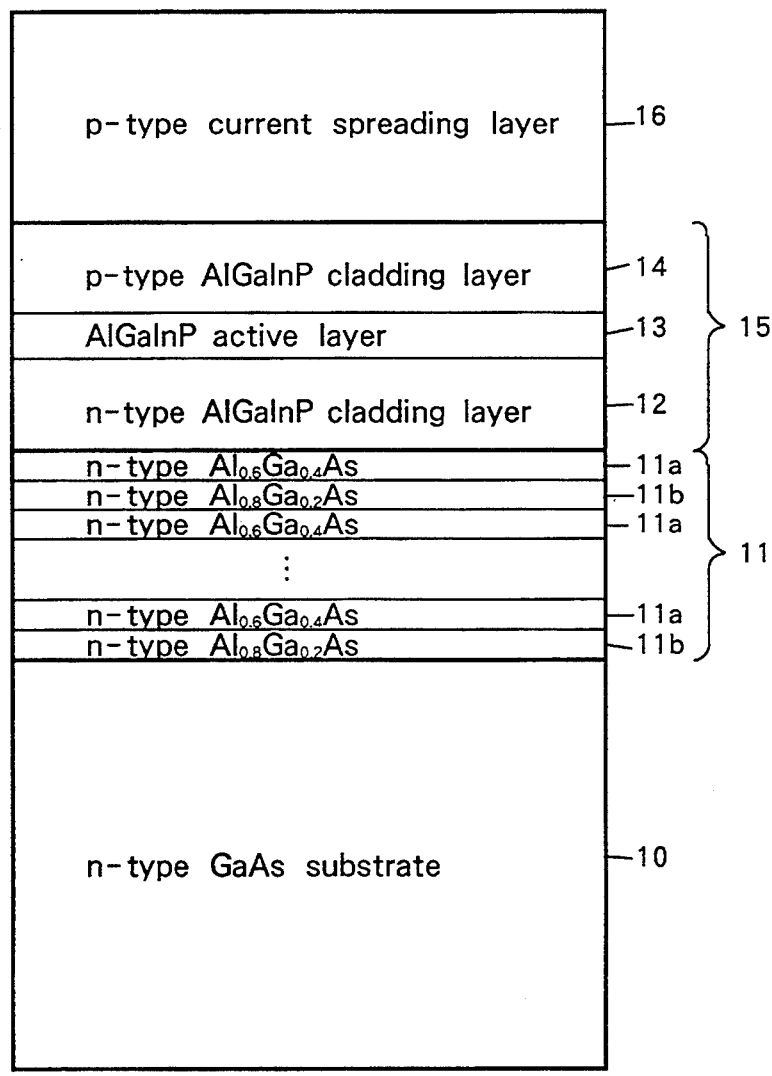
FIG. 3 shows the cross-sectional structure of a conventional light emitting diode.

Examples of this invention are described below in detail by referring to FIGS. 1 through 3.

Figure 1:
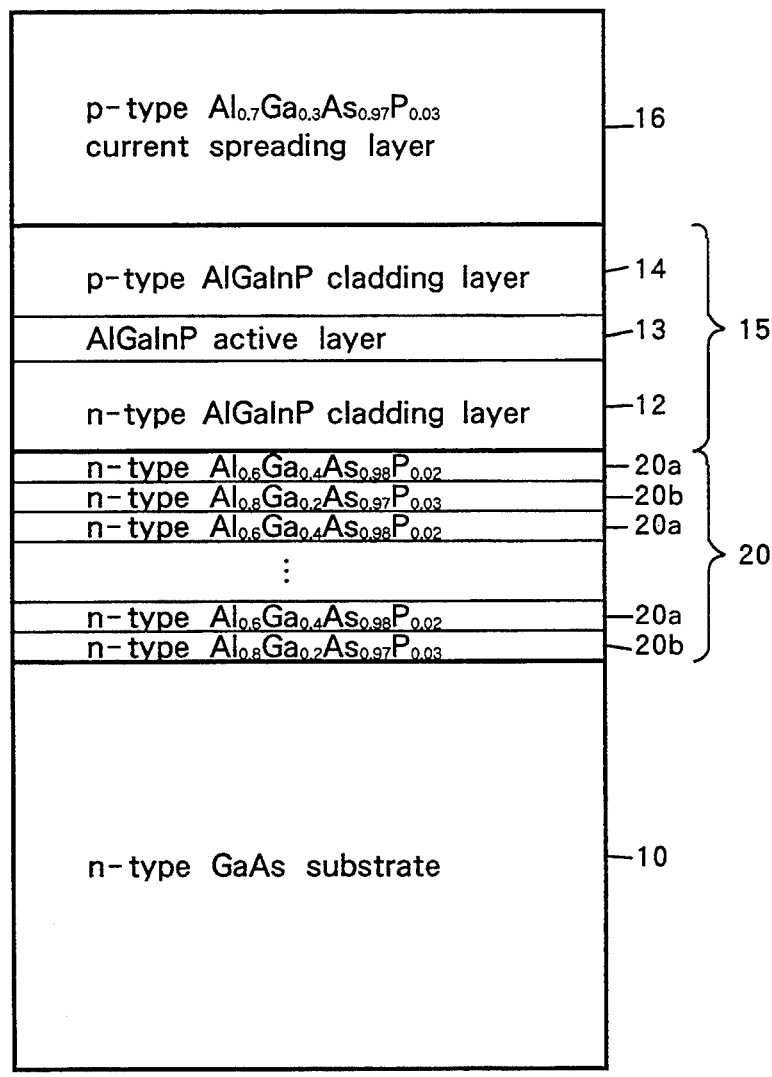
FIG. 1 shows the cross-sectional structure of the light emitting diode of one example of this invention.

FIG. 1 shows the cross-sectional structure of a light emitting diode of one example of this invention. Except for the light reflecting layer, the basic structure of the light emitting diode of this example is the same as that of the conventional light emitting diode shown in FIG. 3. Parts in FIG. 1 which are identical to or equivalent to the counterparts in FIG. 3 are given the same symbols and a description of them is omitted. In the light emitting diode of this example, a light reflecting layer 20, a light emitting layer portion 15, and a p-type $Al_{0.7}Ga_{0.3}As_{0.97}P_{0.03}$ current spreading layer 16 are formed one after another on an n-type GaAs substrate 10. The light reflecting layer 20 comprises a large number of alternately laminated $Al_{0.6}Ga_{0.4}As_{0.98}P_{0.02}$ layers 20a and $Al_{0.8}Ga_{0.2}As_{0.97}P_{0.03}$ layers 20b, each layer having a thickness of approximately 400 Å.

For crystal growth of each epitaxial layer including the light reflection layer 20, the MOVPE method can be used, for example. FIG. 2 shows an example configuration of a growth apparatus used for growing the layers with the MOVPE method. The growing process using this apparatus is as follows: the vapor of various metalorganic compounds of Group III metal elements and hydrides of Group V elements in the gas phase are mixed and the obtained mixed-gas is fed into a process tube 30, with partial pressures and flow rates adjusted according to the desired composition of the growth layer, then the desired growth layers being formed one after another on the n-type GaAs substrate 10 which is placed in the process tube 30.

As source materials for the matrix, trimethyl aluminum (indicated as "TMAl" in FIG. 2) is used as the source for Al, trimethyl gallium (indicated as "TMGa" in FIG. 2) for Ga, trimethyl indium (indicated as "TMIn" in FIG. 2) for In, phosphine ($PH_3$) for P, and arsine ($AsH_3$) for As. For dopants, dimethyl zinc (indicated as "DMZn" in FIG. 2) and hydrogen selenide ($H_2Se$) are used. Needless to say, materials other than these can also be used. For the substrate, a 2-inch GaAs (100) wafer is used. The MOVPE growth may be carried out under the following conditions: the growth temperature is 710° C., the supply ratio of the Group V and Group III elements (V/III ratio) is 100, and the growth rate is 4 micrometers/hour. When growing the AlGaAsP mixed crystals, it is necessary to precisely control the concentrations of $PH_3$ as the source for P and $AsH_3$ for As. This can be easily achieved by a method in which a conventional mass flow controller is used to control the flow rate of each gas. Since a much larger amount of $PH_3$ has to be supplied during growth of AlGaInP and the amount of $PH_3$ to be supplied is largely different from that during growth of AlGaAsP, it is desirable to have two or more supply lines for $PH_3$, as shown in FIG. 2.

The light emitting operation of a light emitting diode prepared as described above was carried out for a life test for 1000 hrs at 50 mA DC, in an environment with a temperature of 85° C., and a relative humidity of 85%. The ratio of brightness after 1000 hrs compared with the initial brightness was 85%. This was an improvement over the 65% ratio for the conventional light emitting diode shown in FIG. 3, in which the p-type $Al_{0.7}Ga_{0.3}As_{0.97}P_{0.03}$ identical to the material used for the example was used for the p-type current spreading layer, for comparison purposes. It was therefore confirmed that the light emitting diode of this example has superior long-term reliability.

In the example described above, the alternately laminated layers comprise $Al_wGa_{1-w}As_{1-v}P_v$. However, it is also possible to use a combination of AlGaAsP and AlGaInP.

In the example described above, two kinds of thin layers are laminated periodically in an orderly manner. However, it is also possible to intentionally disrupt the order of alternate lamination to widen the reflectance band of the light reflecting layer. In general, this would be effective for a light emitting diode with a wide halfwidth of the light emitting spectrum. For example, it is possible to achieve the reflectance band widening by arbitrarily changing the mixed crystal ratio or the thickness of each layer in the alternately laminated layers.

As described thus far, according to this invention, it is possible to significantly reduce the internal stress and to improve the device characteristics, particularly the long-term reliability, of semiconductor light emitting devices.

What is claimed is:

1. A semiconductor light emitting device in which a light emitting layer portion comprising AlGaInP layers is formed on a GaAs substrate and a light reflecting layer portion comprising alternately laminated layers with different refractive indices is provided between said GaAs substrate and said light emitting layer portion, wherein:

said light reflecting layer portion comprises $Al_wGa_{1-w}As_{1-v}P_v$ layers (where, $0 \leq w \leq 1$, $0 < v \leq 0.05\,w$).

2. A semiconductor light emitting device as described in claim 1 wherein:

an active layer constituting said light emitting layer portion comprises an $(Al_yGa_{1-y})_{0.51}In_{0.49}P$ layer (where, $0 \leq y \leq 0.7$).

3. A semiconductor light emitting device as described in claim 1 wherein:
said light reflecting layer portion comprises $Al_{0.6}Ga_{0.4}As_{0.98}P_{0.02}$ layers and $Al_{0.8}Ga_{0.1}As_{0.97}P_{0.03}$ layers which are alternately laminated.

4. A semiconductor light emitting device as described in claim 1 wherein:
each of said alternately laminated layers in said light reflecting layer portion has a thickness of approximately 400 Å.

5. A semiconductor light emitting device as described in claim 1 wherein:
a current spreading layer is provided on said light emitting layer portion.

6. A semiconductor light emitting device as described in claim 5 wherein:
said current spreading layer comprises an $Al_wGa_{1-w}As_vP_{1-v}$ layer (where, $0.45 \leq w < 1$, $0 < v \leq 0.08$).

7. A semiconductor light emitting device as described in claim 1 wherein:
said alternately laminated layers in said light reflecting layer portion are grown by the MOVPE method.

* * * * *